United States Patent [19]

Kanow

[11] 4,083,012
[45] Apr. 4, 1978

[54] AUTOMATIC FUNCTION SETTING AND INDICATION ARRANGEMENT FOR A COMMUNICATIONS RECEIVER

[75] Inventor: Willy Kanow, Berlin, Germany

[73] Assignee: Loewe-Opta GmbH, Kronach, Germany

[21] Appl. No.: 767,377

[22] Filed: Feb. 10, 1977

[30] Foreign Application Priority Data

Feb. 17, 1976 Germany ............................ 2606227

[51] Int. Cl.² ............................................. H03H 5/12
[52] U.S. Cl. ................................... 325/455; 325/464; 334/14
[58] Field of Search ............... 325/455, 176, 337, 464; 307/115; 334/14, 16; 340/147 C, 147 F, 147 MC

[56] References Cited

U.S. PATENT DOCUMENTS

| 3,503,018 | 3/1970 | Cavanagh | 325/455 |
| 3,652,960 | 3/1972 | Sakamoto et al. | 325/455 |
| 3,714,585 | 1/1973 | Koch | 325/464 |
| 3,787,788 | 1/1974 | Le Fevre | 334/14 |
| 3,886,457 | 5/1975 | Petaja | 325/455 |
| 3,903,433 | 9/1975 | Leuschner | 325/464 |
| 3,996,540 | 12/1976 | Yamada et al. | 325/455 |
| 4,031,473 | 6/1977 | Mitarai | 325/455 |

*Primary Examiner*—Benedict V. Safourek
*Assistant Examiner*—Tommy P. Chin

[57] ABSTRACT

A compact and efficient design of a function switching and indication arrangement for a TV receiver or other communications apparatus is described. The functional setting, illustratively indicative of a selected one of a plurality of TV channels, is chosen by the depression of an associated one of a plurality of keys that are respectively connected to externally accessible first switching terminals of a corresponding number of transistorized binary multivibrators that are arranged in an integrated circuit. The outputs of the multivibrators are coupled, on the integrated circuit chip, to a corresponding plurality of multi-collector transistors, one of whose outputs is used to reset the multivibrators of the non-selected channels, and another of whose outputs is employed to set the selected channel itself. A light emitting diode or other suitable visual indicator is connected in series with the key across the terminals of an energizing DC source, so that both such indicator and the key are coupled to a common access switching terminal of the associated multivibrator. The depression of the key serves simultaneously to provide a selection signal for the appropriate channel, to disable the multivibrator and indicator for each of the other channels, and to illuminate the indicator coupled to the depressed key.

5 Claims, 3 Drawing Figures

AUTOMATIC FUNCTION SETTING AND INDICATION ARRANGEMENT FOR A COMMUNICATIONS RECEIVER

BACKGROUND OF THE INVENTION

The invention relates to function setting switching and indicating arrangements for communication receivers, and more particularly to arrangements in a TV receiver for automatically selecting and visually indicating one of a plurality of channels while locking out the switching signals and indications of the non-selected channels.

In known arrangements of this type, a plurality of transistorized bistable multivibrators are arranged on an integrated circuit chip, and one switching terminal of each multivibrator is brought out to an external terminal area of the integrated circuit chip for connection to a corresponding one of a plurality of actuating keys and energizing terminals. The manual depression of one of the keys causes a change of state of the associated multivibrator, which in turn provides a switching signal to an appropriate portion of the TV receiver to set a selected one of the incoming channels. Each change of state of the selected multivibrator is also coupled to an interlock stage of the integrated circuit, which resets each of the remaining multivibrators to extinguish any previously selected channel set signal.

It has been found advantageous, in such arrangements, to associate a light emitting diode or other visual indicator with each of the selectable channel settings, so that when the appropriate key is depressed the then-selected one of the channels may be monitored. Up to this time, the addition of such indication function to each of the channel setting stages of the integrated circuit chip has required the incorporation of additional components on the chip, the terminals of which are also led out, like the switching terminals of the multivibrators, to the terminal area of the chip.

Such arrangement has the disadvantage, particularly when a large number of channels or stations are to be accommodated by the switching components of the chip, of requiring the appropriation of a large part of the functional capability of the integrated circuit chip for visual indication purposes. Such appropriation, in turn, dictates a corresponding elimination of other important functions of the receiver which normally could be controlled by the integrated circuit. As a result, either the efficiency and flexibility of the receiver is diminished, or a larger more complex and costly integrated circuit has to be used.

SUMMARY OF THE INVENTION

All of such disadvantages are overcome with the compact, efficient and inexpensive functional set switching and indication arrangement of the present invention. In an illustrative embodiment, the normal connections of the visual indication components to a separate area of the integrated circuit is eliminated, and the visual indicator, like the actuating key, is coupled directly to the accessible switching terminal of the selected multivibrator for the channel set function.

In particular, the diode, the key and the switching terminal of the selected multivibrator are so arranged that when the key is depressed to change the state of the multivibrator, a low impedance return path to ground is provided for the visual indicator through the collector-emitter path of the now-conductive transistor stage of the multivibrator. Consequently, when the key is released, the indicator remains locked up in its activated position, and will provide the required visual output so long as the multivibrator remains in its new state, i.e., so long as the output of such multivibrator exhibits the required channel set signal.

The output of the then-switched multivibrator is coupled to the base of an associated multi-collector transistor on the integrated circuit chip, one of whose outputs constitutes the switching set signal and the other of whose outputs is fed back to a second, complementary switching terminal of each of the other multivibrators. Upon excitation of the trigger input of each such multi-collector transistor, the interlock output thereof not only resets the remaining multivibrators to eliminate the excitation signals from the base of the associated multi-collector transistor, but will also switch the collector-emitter path of the first transistor stage of such re-set multivibrator back into its high-impedance state, thereby disabling the lock-up path of the associated visual indicator. Consequently, the selection of each channel will automatically extinguish both the channel set signals and the visual indicators of the remaining channels without appropriating any additional functional capability of the integrated circuit chip.

In one feature of the invention, facilities are provided for assuring that upon the turn-on of the communications receiver, a predetermined one of the channels is always selected. This is accomplished by associating, with the actuating key of such predetermined channel, a diode and a charging condenser, with the charging path of the condenser being established through the associated visual indicator and the discharge path of the condenser being established by a separate high-impedance resistor. The capacitor is connected in parallel with the actuating key via the above-mentioned diode, so that when the capacitor charges to a value corresponding to the trigger amplitude normally applied to the first switching terminal of the selected multivibrator by the depression of the key, the state of such multivibrator is automatically switched to provide the channel set and indication function as indicated above. Conversely, when the set is turned off, the capacitor is discharged through the associated high-impedance resistor, thereby conditioning such capacitor for immediate charge when the set is turned on again.

BRIEF DESCRIPTION OF THE DRAWING

The invention is further set forth in the following detailed description taken in conjunction with the appended drawing, in which.

DETAILED DESCRIPTION

Figure 1:
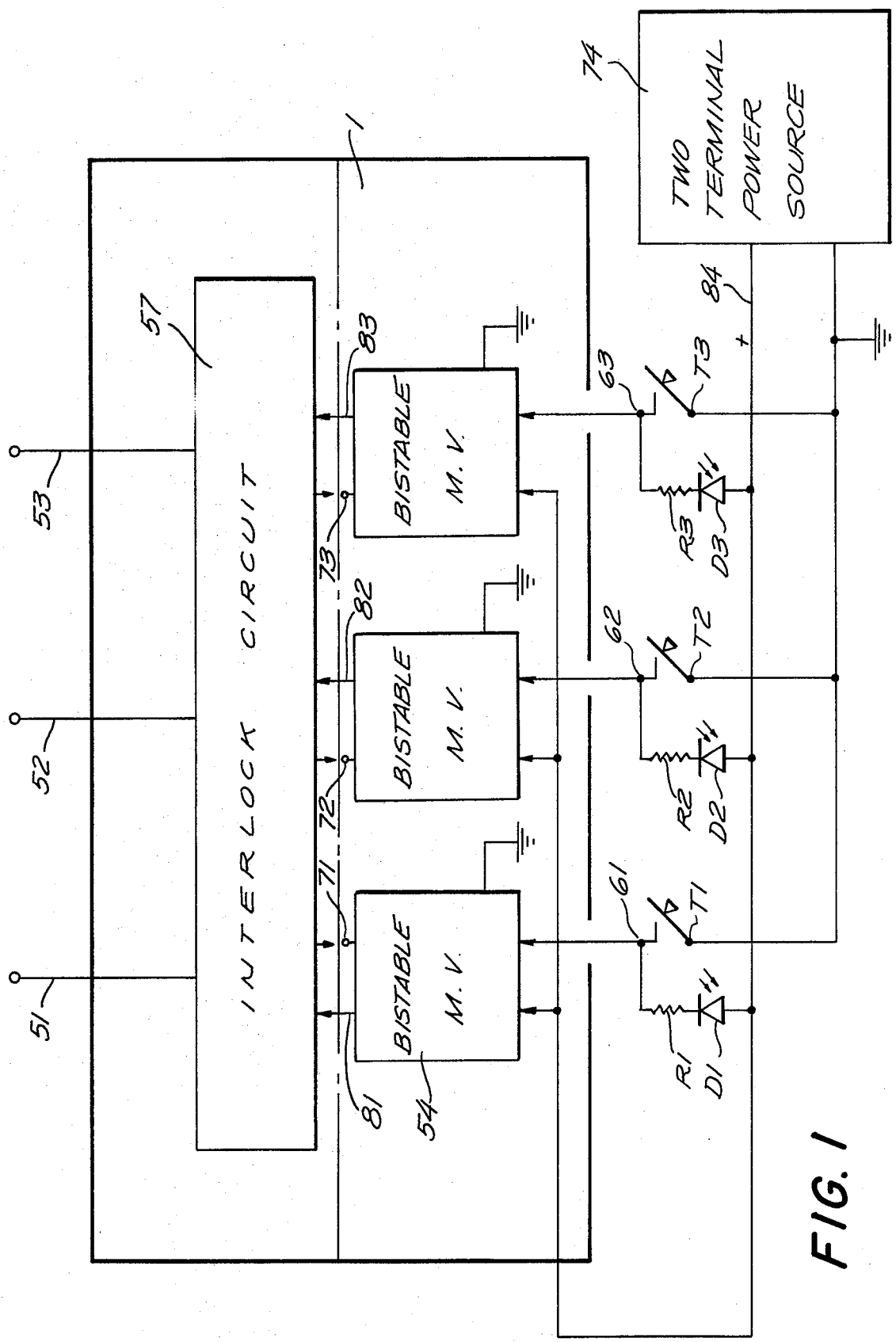
FIG. 1 is a combined block and schematic diagram of an arrangement constructed in accordance with the invention for automatically instrumenting a channel set switching, indication and interlock function in a TV receiver.

Referring now to the drawing, FIG. 1 depicts an integrated circuit chip 1 which contains suitable switching and interlock circuitry for providing a selection of a desired one of N functional settings of an associated communications receiver, such as a TV set, which is not further identified. In the particular arrangement shown in FIG. 1, the set function is assumed to be a channel switching operation, and for simplicity the depicted apparatus is adapted for the selection of one of a total of three available channels. Output terminals designated at 51, 52 and 53 of the circuit chip 1 are illustrated for providing access to suitable conventional switching set signals for the appropriate one of such three channels.

A corresponding plurality of manually actuable keys T1, T2 and T3 are associated with the channel-switching chip 1 for activating a desired one of the outputs 51, 52 and 53. Illustratively, the respective keys T1, T2 and T3 are individually adapted to activate the terminals 51, 52 and 53 via an associated one of a plurality of bistable gates 54, 55 and 56 and a common interlock circuit 57 mounted on the chip 1. For this purpose, the key T1 is connected to a first externally accessible switching terminal 61 of the gate 54. Similarly, the key T2 is connected to an accessible switching terminal 62 of the gate 55, and the key T3 is connected to an accessible switching terminal 63 of the gate 56.

The respective gates 54, 55 and 56 are also provided with second switching terminals 71, 72 and 73, which are complementary to the externally accessible terminals 61, 62 and 63. Each of the gates 54–56 are energized by means of a two-terminal voltage source 74.

As indicated in FIG. 1, the respective terminals of the keys T1, T2 and T3 remote from their connection to the integrated circuit chip 1 are returned to a common negative terminal of the source 74.

Each of the gates 54–56 is arranged as a bistable multivibrator. Using the gate 54 as illustrative, the application of a switching voltage to the externally accessible first terminal 61 thereof as indicated below will cause the multivibrator 54 to be switched into a state in which it exhibits a relatively low impedance between the switching terminal 61 and the common terminal (hereafter referred to as "ground") of the source 74. Conversely, the application of the switching voltage to the complementary switching terminal 71 will result in a relatively high impedance between terminal 61 and ground.

In addition, the multivibrator 54 is so arranged that upon the establishment of a low impedance between the terminals 61 and ground, a relatively high voltage will be present at an output terminal 81 of the multivibrator, such output terminal being connected to the interlock circuit 57. Again conversely, the presence of a high impedance between the terminals 61 and ground will cause the output terminal 81 to exhibit a relatively low voltage (it will be understood that the other multivibrators 55 and 56 will exhibit corresponding functions, including appropriate voltage levels on output terminals 82 and 83 thereof, corresponding identically to the terminal 81 of the multivibrator 54).

As will be explained in more detail below, the interlock circuit 57 will respond to the presence of a relatively high voltage level from one of the associated multivibrator outputs 81, 82 and 83 to generate a switching signal that is applied to the corresponding one of the second inputs 71–73 of the remaining multivibrators. As suggested above, such switching function will be effective to establish a high impedance across the first accessible switching terminals of such latter multivibrators and ground; and in turn, such high-impedance states will assure a relatively low output of voltage from the corresponding ones of the outputs 81–83.

The arrangement of FIG. 1 further includes a plurality of light-emitting diodes D1, D2 and D3 which are individually connected, via resistors R1, R2 and R3, between a positive terminal 84 of the source 74 and a corresponding one of the three externally accessible multivibrator switching terminals 61 – 63. The diodes D1 – D3 are employed as visual indicators for the presence of a switching signal on the channel set output terminals 51 – 53, respectively, of the integrated circuit chip 1; and their connection with the same multivibrator switching terminals as those associated with the keys T1 – T3 serves, in accordance with the invention, to provide full channel switching and visual indication capability of the depicted apparatus without appropriating any additional functional capability of the integrated circuit 1, as in the prior art. Such advantage will now be further explained in connection with FIG. 2.

Figure 2:
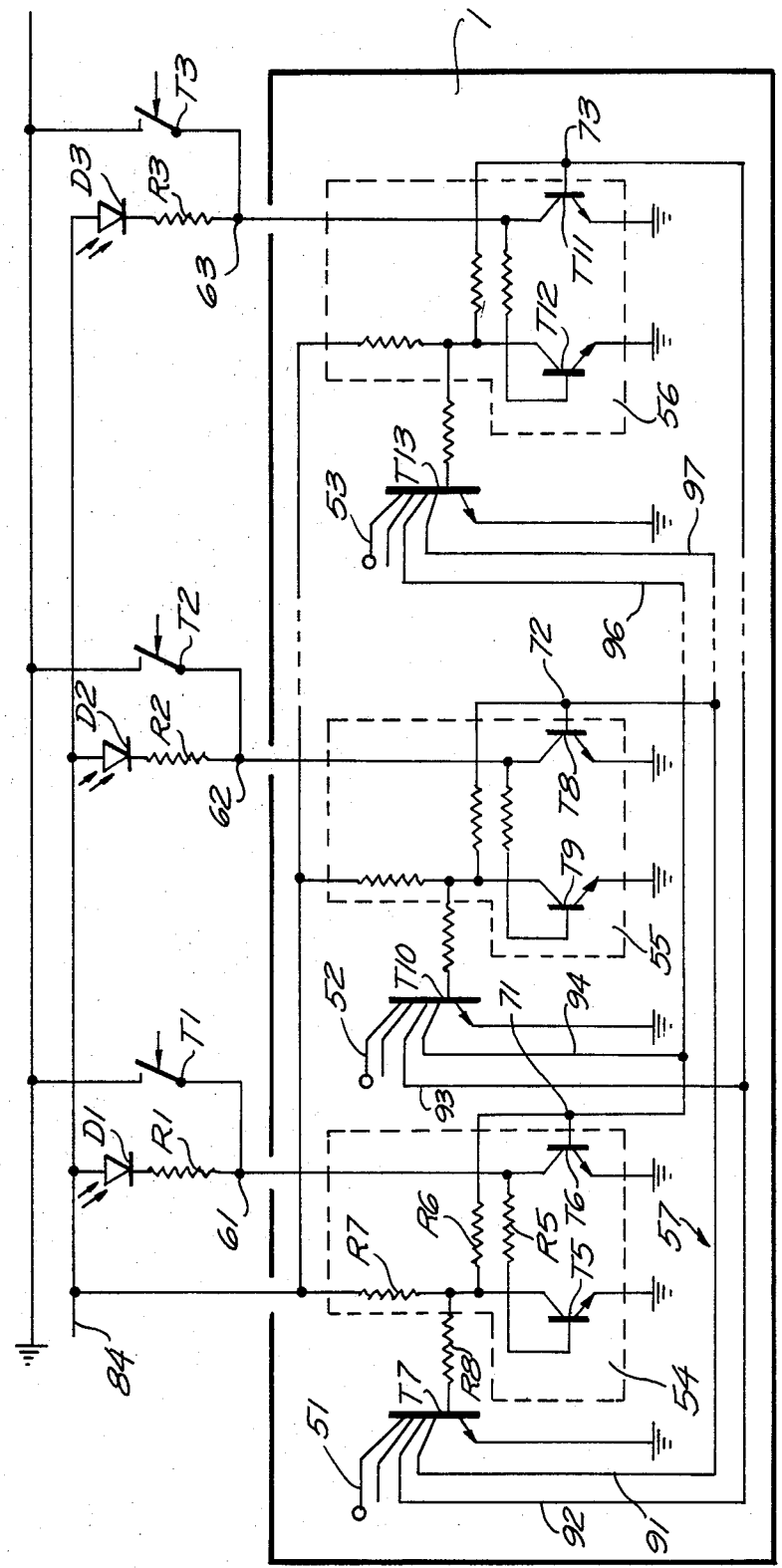
FIG. 2 is an overall schematic diagram giving further details of the channel set switching and interlock functions of the arrangement of FIG. 1.

As illustrated in detail in FIG. 2, each of the multivibrators 54, 55 and 56 includes a pair of cross-coupled transistors. Again employing the multivibrator 54 as illustrative, the constituent transistors are identified at T5, T6, with the externally accessible switching terminal 61 being joined to the collector of the transistor T6, while the complementary switching terminal 71 thereof is coupled to the base of the transistor T6.

The collector of the transistor T6 is coupled via resistor R5 to the base of the complementary transistor T5, and the base of the transistor T6 is coupled via resistor R6 to the collector of the transistor T5. The output of the multivibrator 54 is taken from the collector of the transistor T5. The emitters of the transistors T5 and T6 are each coupled to ground, while the positive terminal 84 of the source 74 is coupled to the collector of the transistor T5 through resistor R7.

As indicated, the excitation and ground terminals, as well as the internal switching connections, of the remaining multivibrators 55 and 56 (employing transistors T8, T9 and T11, T12, respectively) correspond to those of the multivibrator 54.

The interlock circuit 57 of FIG. 1 includes, in the arrangement of FIG. 2, three multi-collector transistors T7, T10 and T13, which are individually associated with the multivibrators 54, 55 and 56. The output of the multivibrator 54 is coupled through resistor R8 to the base, or trigger input, of the transistor T7. In like manner, the output terminal 82 of the multivibrator 55 is coupled to the base of the transistor T10, and the output terminal 83 of the multivibrator 56 is coupled to the base of the transistor T13. Corresponding first ones of the outputs of the respective transistors T7, T10 and T13 terminate in channel set output terminals 51, 52 and 53. Thus, when one of the transistors T7, T10 and T13 is driven into conduction, the corresponding change of state on the relevant output 51, 52 or 53 represents the switching set signal for the selected channel.

The transistor T7 associated with the multivibrator 54 is also provided with two auxiliary collector outputs 91 and 92, which are respectively coupled on the chip 1 to the second switching terminals 72 and 73 of the other multivibrators 55 and 56.

The transistor T10 associated with the multivibrator 55 has a pair of auxiliary collector outputs 93, 94 which are individually connected to the second switching terminals 71, 73 of the multivibrators 54, 56. Similarly, the transistor T13 associated with the multivibrator 56 has a pair of auxiliary outputs 96, 97 which are respectively coupled to the second switching terminals 71 and 72 of the multivibrators 54 and 55.

The operation of the channel set switching and indicating arrangement of FIG. 2 will now be described. It will be assumed that the channel which is desired to be set is that associated with the terminal 51, which is controlled by the key T1, and that at the time of selection the channel then operative on the associated TV set is that controlled by the output 52, by a previous depression of the key T2. Accordingly, immediately prior to the depression of the key T1 to select the now-desired channel, it will be assumed that the light-emitting diode D2 associated with the previously selected channel is illuminated, while the remaining diodes D1 and D3 are not.

When the key T1 is depressed, a switching voltage, representing a negative-going transistion at the externally accessible switching terminal 61 of the associated multivibrator 54, will be applied to the base of the transistor T5 via the resistor R5. This action will effectively cut off the transistor T5, so that the voltage at its collector terminal 82 will rise to a relatively high value. Such positive-going jump in voltage at the output terminal 82 of the multivibrator 54 will correspondingly trigger on the transistor T7 of the interlock circuit 57, and a corresponding switching set signal for the desired channel will be present at the output terminal 51 of the chip 1.

The positive-going voltage at the collector of the transistor T5 will be coupled, via resistor R6, to the base of the transistor T6, thereby switching such transistor into its "on" condition. Upon attaining such condition, the collector-emitter path of the transistor T6 will constitute a low-impedance return path to ground for the positive source voltage 84 through the diode D1 and the resistor R1, and the corresponding flow of current through the diode D1 will cause it to illuminate to indicate the presence of the channel-switching voltage on the terminal 51.

Because of the bistable nature of the multivibrator 54, the release of the key T1 at this time will not effect any change in state of the transistor T6, so that a lock-up path for the diode D1 to the source 74 will be maintained, and the diode will remain illuminated.

The triggering on of the transistor T7, besides providing the channel switching function on the output 51, will also cause excitation signals on the other collectors 91, 92 thereof to exhibit negative-going voltage transitions, which are individually coupled to the second switching terminals 72 and 73 of the multivibrators 55 and 56. The application of such negative-going voltage to the terminal 72 of the multivibrator 56 will cut off the transistor T8, thereby disabling the lock-up path that had previously been established to ground for the diode D2, so that the latter will now be extinguished.

At the same time, the rise in voltage at the collector of the transistor T8 resulting from the cutoff of such device will be coupled to the base of the transistor T9, so that the latter will be triggered into conduction to generate a negative-going transition on its collector or output terminal 83. Such transition, in turn, will cut off the associated transistor T10 in the interlock circuit 57. Such action will disable the channel set signal on the output terminal 52.

The negative-going transition on the output line 97, occurring when the channel set terminal 51 is activated, will be effective to disable the transistor T13 of the multivibrator 56; therefore, in the event that the previously-selected channel was that corresponding to the terminal 53, the correspondingly illuminated diode D3 would be extinquished, and the channel set signal on the terminal 53 would be removed.

It will be apparent from the foregoing description that the required simultaneous functions of channel setting, interlock and visual channel set indiction are efficiently accomplished with the arrangement of FIGS. 1-2 without the use of any further information capability of the printed circuit chip 1 than would have been necessary to instrument merely the channel set and interlocking functions in the prior art.

An an additional feature of the invention, additional facilities may be associated with the channel set circuitry for one of the selectable channels on the terminals 51-53 so that, upon the initial energizing of the associated TV set, a predetermined one of the three depicted channels (illustratively that ordinarily selected by the key T3) is activated. For this purpose, a serial path including an additional diode D4 and a capacitor C1 is connected between the externally accessible switching terminal 63 and ground. The diode D4 is poled in its low-impedance direction relative to the positive terminal 84, which is connected to the diode D4 through the indicating diode D3 and the resistor R3.

Figure 3:
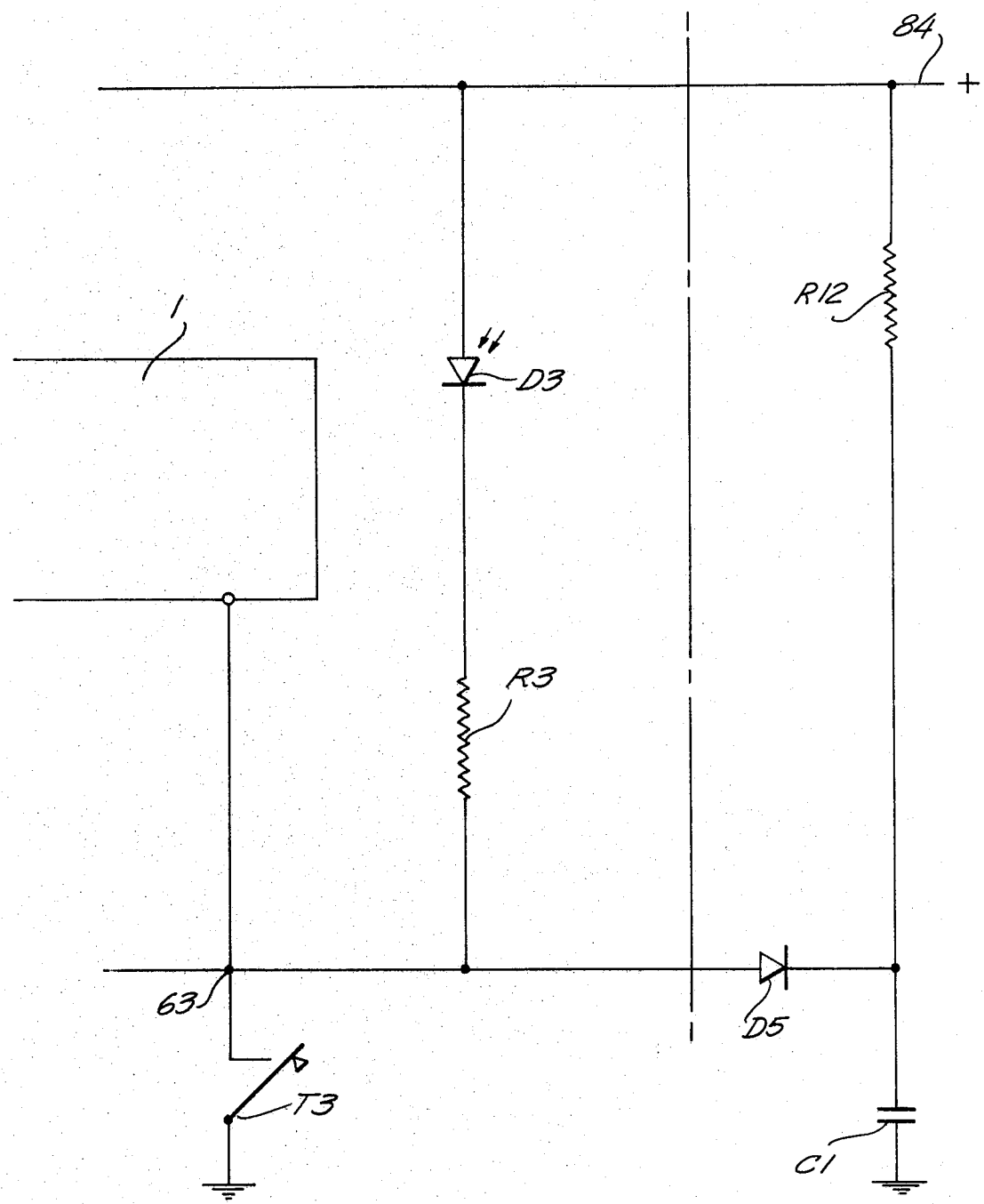
FIG. 3 is a combined block and schematic diagram of an arrangement associated with one of the switching stages of FIGS. 1 and 2 for automatically selecting the associated channel when the arrangement is first energized.

The arrangement of FIG. 3 further includes a resistor R12 which is coupled between the positive source terminal 84 and the junction of the diode D4 and the capacitor C1. The resistor R12 is assigned a much higher resistance value than the resistor R3, so that the latter resistor functions as a low-impedance charging resistor for the capacitor C1, while the resistor R12 functions as a high-impedance discharge resistor.

In particular, when the TV set is first turned on to apply the positive voltage on the line 84 to the illustrated arrangement, the capacitor C1 will charge up toward the source voltage, and when the voltage thereacross corresponds to the effective switching voltage at the switching terminal 63, the associated multivibrator 56 (FIG. 2) will be actuated to provide a low-impedance between the terminal 63 and ground in the manner indicated above. As a result, a lock-up path from the line 84 to ground will be established through the multivibrator 56 for the diode D3, and the required channel set switching signal will be applied to the appropriate terminal 53 as also described above. All of such action takes place, of course, without any intervening depression of the key T3.

At this time, the switching terminal 61 will be maintained approximately at ground potential, so that the diode D4 will be reverse-biased.

Upon the removal of excitation from the line 84 (i.e., when the associated TV set is switched off), the capacitor C1 will discharge through the high-impedance resistor R12, so that upon the next-succeeding turn-on of the set, the channel associated with the output terminal 53 can again be automatically set.

In the foregoing, an illustrative arrangement of the invention has been described. Many variations and modifications will now occur to those skilled in the art. For example, it will be understood that an incandescent bulb or other suitable visual indicator can be substituted for the light-emitting diodes D1 - D3 of FIGS. 1-3. It is accordingly desired that the scope of the appended claims not be limited to the specific disclosure herein contained.

What is claimed is:

1. An arrangement connectable to a two-terminal power source for simultaneously (a) providing an activating signal for a selected one of first and second functional settings in a communications receiver, (b) providing a visual indication of the selected setting and (c) disabling any activating signal and visual indication then present for the non-selected setting, the arrangement comprising, in combination, first and second selection keys, first and second electrically activated illuminating means, first and second bistable multivibrators each having a first switching terminal and a complementary second switching terminal, the respective first ones of the keys, illuminating means and multivibrators being individually associated with the first setting and the respective second ones of the keys, illuminating means and multivibrators being associated with the second setting, means associating each of the multivibrators with a first terminal of the power source for establishing a relatively low impedance between the first switching terminal of the multivibrator and the first terminal of the power source upon the application of a prescribed switching voltage to the first switching terminal of the multivibrator and for establishing a relatively high impedance between the first switching terminal and the first terminal of the power source upon the application of the switching voltage to the second switching terminal of the multivibrator, means for individually coupling each illuminating means between the other terminal of the power source and the first switching terminal of the associated multivibrator, means individually connecting each key between the first terminal of the source and the first switching terminal of the associated multivibrator for simultaneously applying the switching voltage to the first switching terminal of the associated multivibrator and for activating the associated illuminating means when the key is actuated, first and second gating means each having a trigger input and at least first and second outputs which are actuated in parallel when the trigger input thereof is excited, the first output of each gating means exhibiting the switching voltage when the associated trigger input is excited, means coupling the second switching terminal of the first multivibrator to the trigger input of the first gating means for exciting said trigger input when the switching voltage is applied to the first switching terminal of the first multivibrator, means coupling the second switching terminal of the second multivibrator to the trigger input of the second gating means for exciting said trigger input when the prescribed switching voltage is applied to the first switching terminal of the second multivibrator, means for coupling the first output of the first gating means to the second switching terminal of the second multivibrator, and means for coupling the first output of the second gating means to the second switching terminal of the first multivibrator, the second outputs of the first and second gating means individually constituting the activating signals for the first and second settings, respectively.

2. An arrangement is defined in claim 1, in which each of the first and second multivibrators comprises, in combination, first and second transistors, means for cross-coupling the base of the first transistor to the collector of the second transistor, means for cross-coupling the base of the second transistor to the collector of the first transistor, and means for coupling the emitters of each of the first and second transistors to the first terminal of the power source, the collector and base of the first transistor constituting the first and second switching terminals, respectively, of the associated multivibrator.

3. An arrangement as defined in claim 2, in which each of the first and second gating means comprises, in combination, a multi-collector third transistor and means for connecting the emitter of the third transistor to the first terminal of the power source, the base of the third transistor constituting the trigger input thereof, the collectors of the third transistor respectively constituting the outputs thereof.

4. An arrangement as defined in claim 1, in which each illuminating means is a light-emitting diode.

5. An arrangement as defined in claim 1, in which the means for individually coupling each illuminating means between the other terminal of the source and the first switching terminal of the associated multivibrator comprises a first resistor; and in which the arrangement further comprises, in combination, a first serial path including a diode and a capacitor, means for connecting the first serial path between the first terminal of the source and the first switching terminal of a selected one of the first and second multivibrators with the diode being poled to establish a low-impedance charging path therefor between the terminals of the source via the illuminating means and the first resistor associated with the selected multivibrator, and a second resistor coupled between the other terminal of the source and the junction of the diode and the capacitor in the first serial path, the value of the second resistor being significantly larger than that of the first resistor to constitute a high-impedance discharge path for the capacitor.

* * * * *